United States Patent
Kawamura

(10) Patent No.: US 9,620,624 B2
(45) Date of Patent: Apr. 11, 2017

(54) METHOD OF MANUFACTURING A SEMICONDUCTOR DEVICE

(71) Applicant: Japan Display Inc., Minato-ku (JP)

(72) Inventor: Shinichi Kawamura, Tokyo (JP)

(73) Assignee: Japan Display Inc., Minato-ku (JP)

(*) Notice: Subject to any disclaimer, the term of this patent is extended or adjusted under 35 U.S.C. 154(b) by 0 days.

(21) Appl. No.: 15/049,469

(22) Filed: Feb. 22, 2016

(65) Prior Publication Data

US 2016/0268398 A1 Sep. 15, 2016

(30) Foreign Application Priority Data

Mar. 11, 2015 (JP) ................. 2015-048150

(51) Int. Cl.
*H01L 21/8242* (2006.01)
*H01L 29/66* (2006.01)
*H01L 21/266* (2006.01)
*H01L 21/3213* (2006.01)

(52) U.S. Cl.
CPC ...... *H01L 29/66742* (2013.01); *H01L 21/266* (2013.01); *H01L 21/32139* (2013.01); *H01L 29/66492* (2013.01)

(58) Field of Classification Search
CPC ................................. H01L 29/6659
See application file for complete search history.

(56) References Cited

U.S. PATENT DOCUMENTS

| 4,601,095 A | * | 7/1986 | Kikuchi | ............... H01L 21/28 257/E21.158 |
| 6,362,031 B1 | * | 3/2002 | Yamaguchi | ....... H01L 29/78618 257/E21.414 |
| 2002/0105033 A1 | | 8/2002 | Zhang | |
| 2009/0104737 A1 | | 4/2009 | Sato et al. | |

FOREIGN PATENT DOCUMENTS

| JP | 2000-277738 | 10/2000 |
| JP | 2009-99888 | 5/2009 |

* cited by examiner

*Primary Examiner* — Zandra Smith
*Assistant Examiner* — Andre' C Stevenson
(74) *Attorney, Agent, or Firm* — Oblon, McClelland, Maier & Neustadt, L.L.P.

(57) ABSTRACT

According to one embodiment, a method of manufacturing a semiconductor device comprises forming a semiconductor layer on a substrate, forming a first insulating film on the semiconductor layer, forming a metal layer on the first insulating film, forming a first portion and a second portion in the metal layer, implanting an impurity into the semiconductor layer by using the first portion and the second portion as masks, forming a gate electrode by reducing the second portion in addition to removing the first portion, and implanting an impurity into the semiconductor layer by using the gate electrode as a mask.

17 Claims, 4 Drawing Sheets

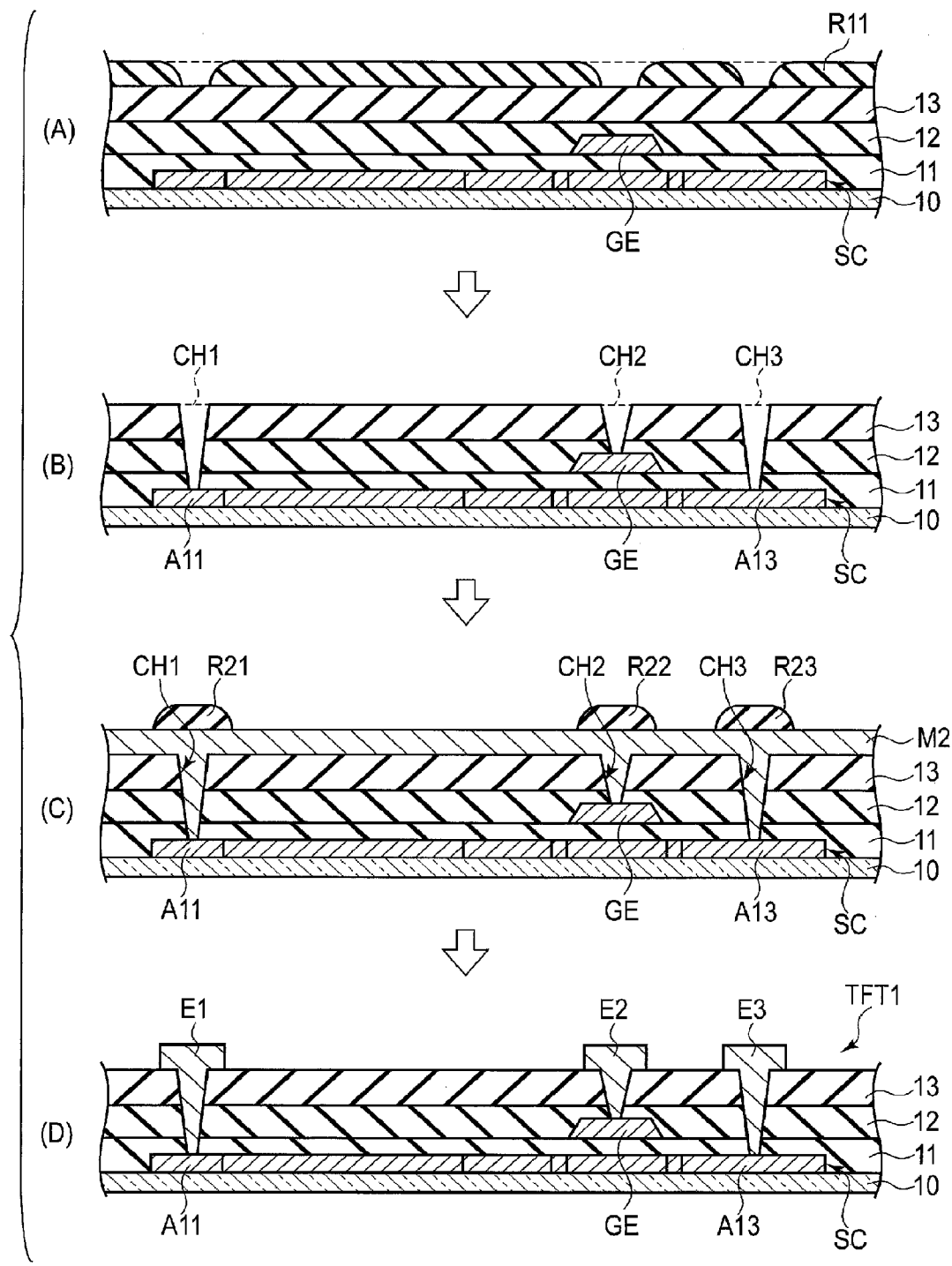
F I G. 3

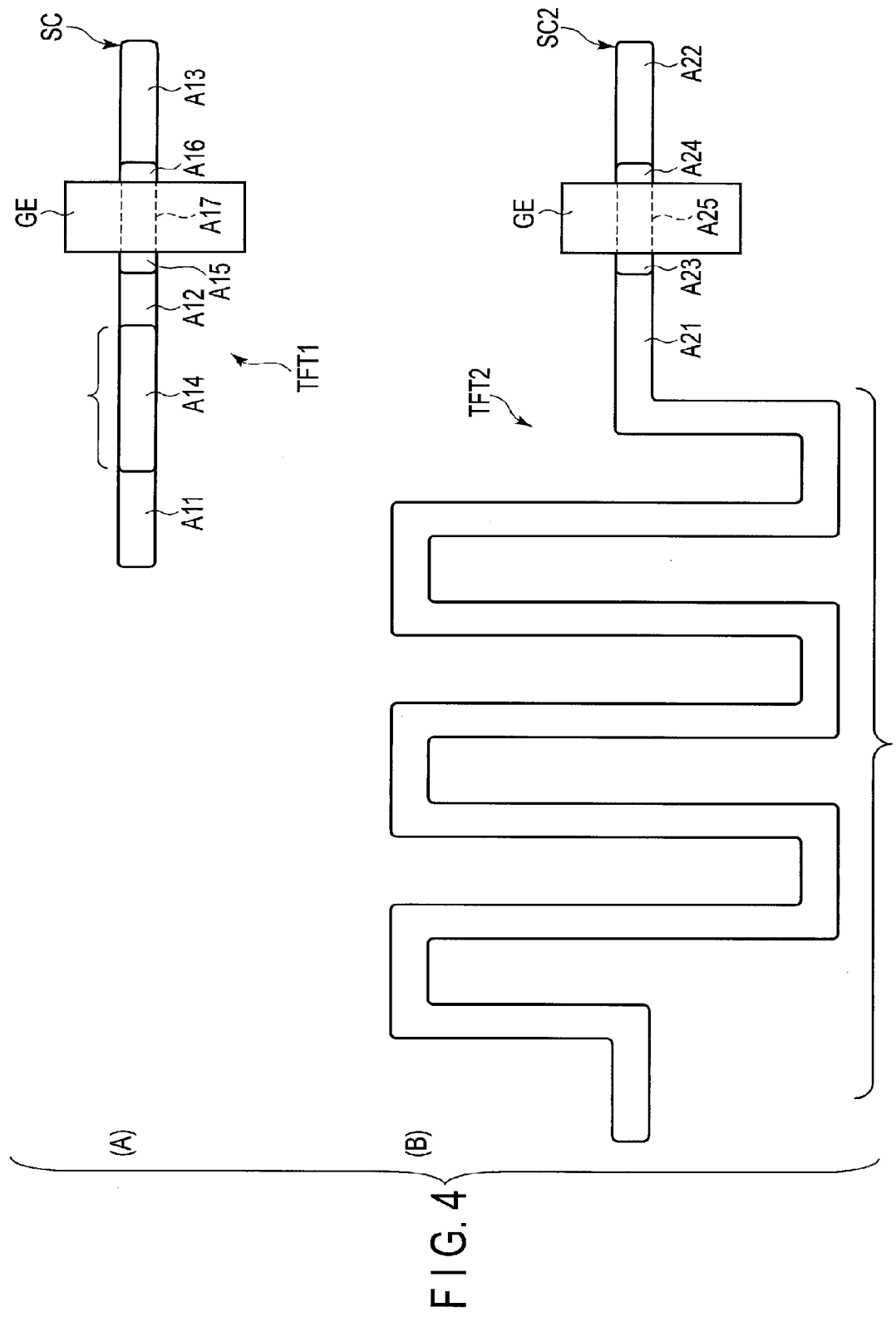

METHOD OF MANUFACTURING A SEMICONDUCTOR DEVICE

CROSS-REFERENCE TO RELATED APPLICATIONS

This application is based upon and claims the benefit of priority from Japanese Patent Application No. 2015-048150, filed Mar. 11, 2015, the entire contents of which are incorporated herein by reference.

FIELD

Embodiments described herein relate generally to a method of manufacturing a semiconductor device.

BACKGROUND

There is known a technology of forming a low-impurity-concentration area by implanting an impurity into a first area, which is outside an area corresponding to a channel area in a semiconductor layer, after forming a gate electrode, and forming a source/drain area by implanting an impurity at high concentration into an outside portion of the first area after covering the low-impurity-concentration area with a resist mask.

Also known are a technology of forming a lightly-doped-drain (LDD) thin-film transistor by, using a resist as a mask, implanting an impurity, and further implanting an impurity after removing the resist; and a technology of changing the film thickness of a resist by exposing the resist with a halftone mask.

BRIEF DESCRIPTION OF THE DRAWINGS

FIG. 3 is a view for describing a method of manufacturing the semiconductor device of the present embodiment.

FIG. 4 is a plan view which shows an example of a semiconductor layer SC in a thin-film transistor TFT1 of the present embodiment, and a semiconductor layer SC2 in a thin-film transistor TFT2 of a comparative example.

DETAILED DESCRIPTION

Figure 1:
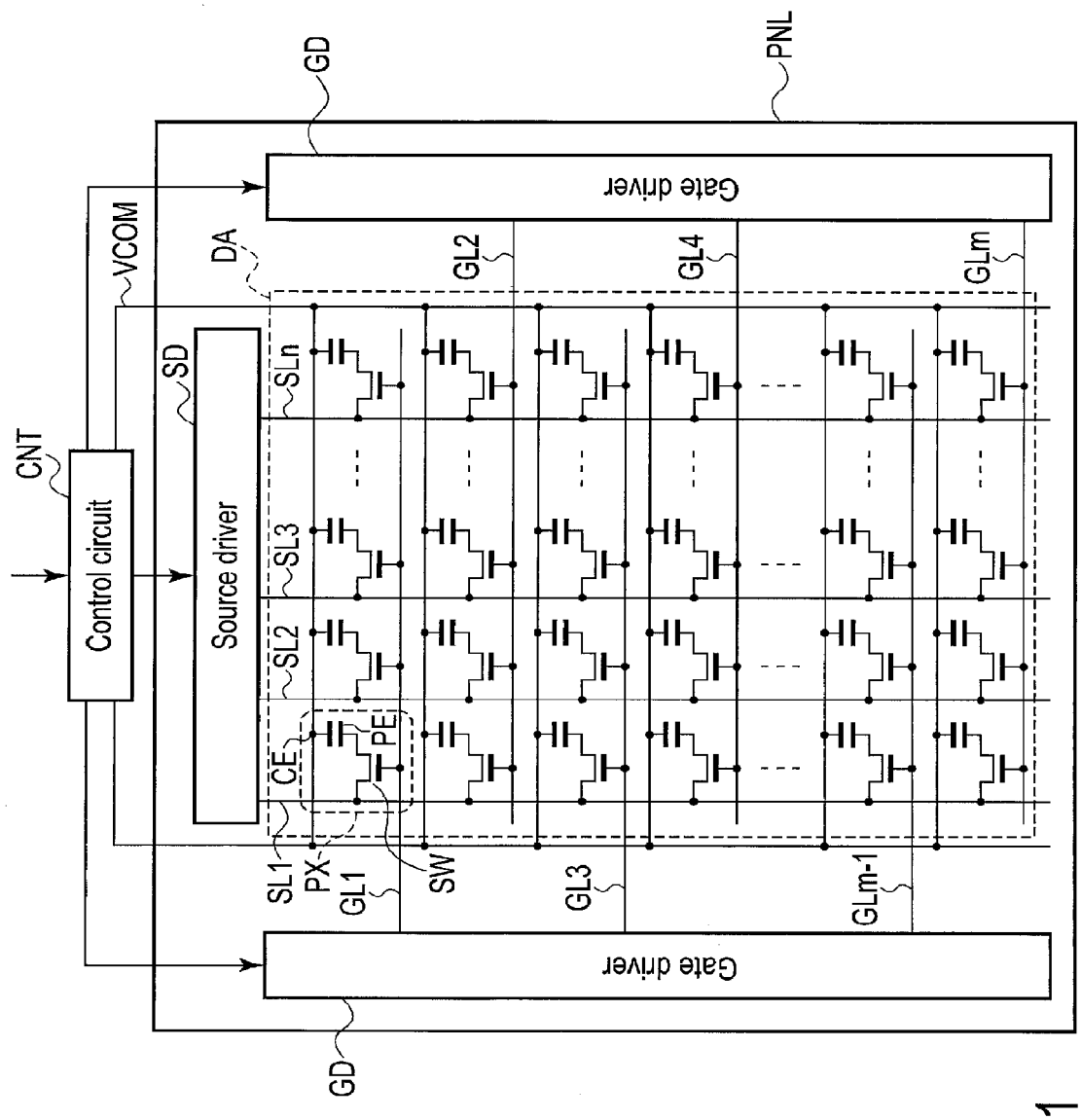
FIG. 1 is a diagram which schematically shows a structure of a display device DSP to which a semiconductor device of the present embodiment can be applied.

In general, according to one embodiment, a method of manufacturing a semiconductor device comprises forming a semiconductor layer on a substrate, forming a first insulating film on the semiconductor layer, forming a metal layer on the first insulating film, forming a first portion and a second portion in the metal layer, implanting an impurity into the semiconductor layer by using the first portion and the second portion as masks, forming a gate electrode by reducing the second portion in addition to removing the first portion, and implanting an impurity into the semiconductor layer by using the gate electrode as a mask.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the structural elements, which have functions identical or similar to the functions described in connection with preceding drawings, are denoted by the same reference numbers, and an overlapping detailed description thereof may be arbitrarily omitted.

FIG. 1 is a drawing which schematically shows a structure of a display device DSP to which a semiconductor device of the present embodiment can be applied. Note that in the present embodiment, a case where the display device DSP is a liquid crystal display device is described. However, no limitation is intended thereby, and the display device DSP may be a self-luminous display device comprising organic electroluminescent display elements, etc., an electronic paper display device comprising cataphoretic elements, etc., a display device employing micro-electromechanical systems (MEMS), or a display device employing electrochromism.

The display device DSP includes an active matrix display panel PNL, and a driving unit which supplies a signal for displaying an image to the display panel PNL. In one example, the display panel PNL is a liquid crystal display panel in which a liquid crystal layer is held between a pair of substrates. The display panel PNL includes a display area DA where an image is displayed. The display area DA is constituted by a plurality of pixels PX arrayed in a matrix. The display panel PNL comprises a plurality of gate lines GL (GL1 to GLm), a plurality of source lines SL (SL1 to SLn), etc., in the display area DA, where m and n are positive integers.

The driving part includes gate drivers GD, a source driver SD, and a control circuit CNT. At least some parts of the gate drivers GD and the source driver SD are formed on the display panel PNL. The control circuit CNT is provided on a driving IC chip, a flexible printed circuit board, and the like, which are mounted on the display panel PNL.

Each of the gate lines GL is drawn outside the display area DA to be electrically connected to the one of the gate drivers GD. Each of the source lines SL is drawn outside the display area DA to be electrically connected to the source driver SD. Peripheral circuits such as the gate drivers GD and the source driver SD comprise, for example, an N-type thin-film transistor, a P-type thin-film transistor, and a complementary thin-film transistor in which the N- and P-type thin-film transistors are combined, although a detailed explanation of any of these transistors will not be given. Note that the structure of the gate drivers GD and the source driver SD is not limited to the example illustrated in the drawing.

Each of pixels PX comprises a switching element SW, a pixel electrode PE, a common electrode CE, etc. The switching element SW is constituted by, for example, an N-type thin film transistor. The switching element SW is electrically connected to the gate line GL and the source line SL. The pixel electrode PE is electrically connected to the switching element SW. The common electrode CE is disposed in common to pixel electrodes PE of the plurality of pixels PX. A capacitance is formed between the common electrode CE and each of the pixel electrodes PE, and an image signal (voltage) necessary for displaying each pixel PX is held.

The control circuit CNT generates various signals necessary for displaying images on the display area DA based on external signals supplied from an external signal source, and outputs the generated signals to each of the gate drivers GD and the source driver SD. Also, the control circuit CNT applies a common potential (VCOM) to the common electrode CE. The gate drivers GD supply a scanning signal to each gate line GL. The source driver SD supplies an image signal to each source line SL. Switching elements SW connected to the same gate line GL can be switched between a conductive state and a nonconductive state on the basis of the scanning signal supplied to each gate line GL. The image signal supplied to the source line SL when the switching element SW is in the conductive state is supplied to the pixel electrode PE via the switching element SW. At this time, an electric field is produced according to a potential difference between the potential of the pixel electrode PE and the potential of the common electrode CE. The direction of alignment of the liquid crystal molecules included in the liquid crystal layer is controlled by the electric field produced between the pixel electrode PE and the common electrode CE. The image signal written to each pixel PX is held with a capacitance between the pixel electrode PE and the common electrode CE until the next image signal is written.

Figure 2:
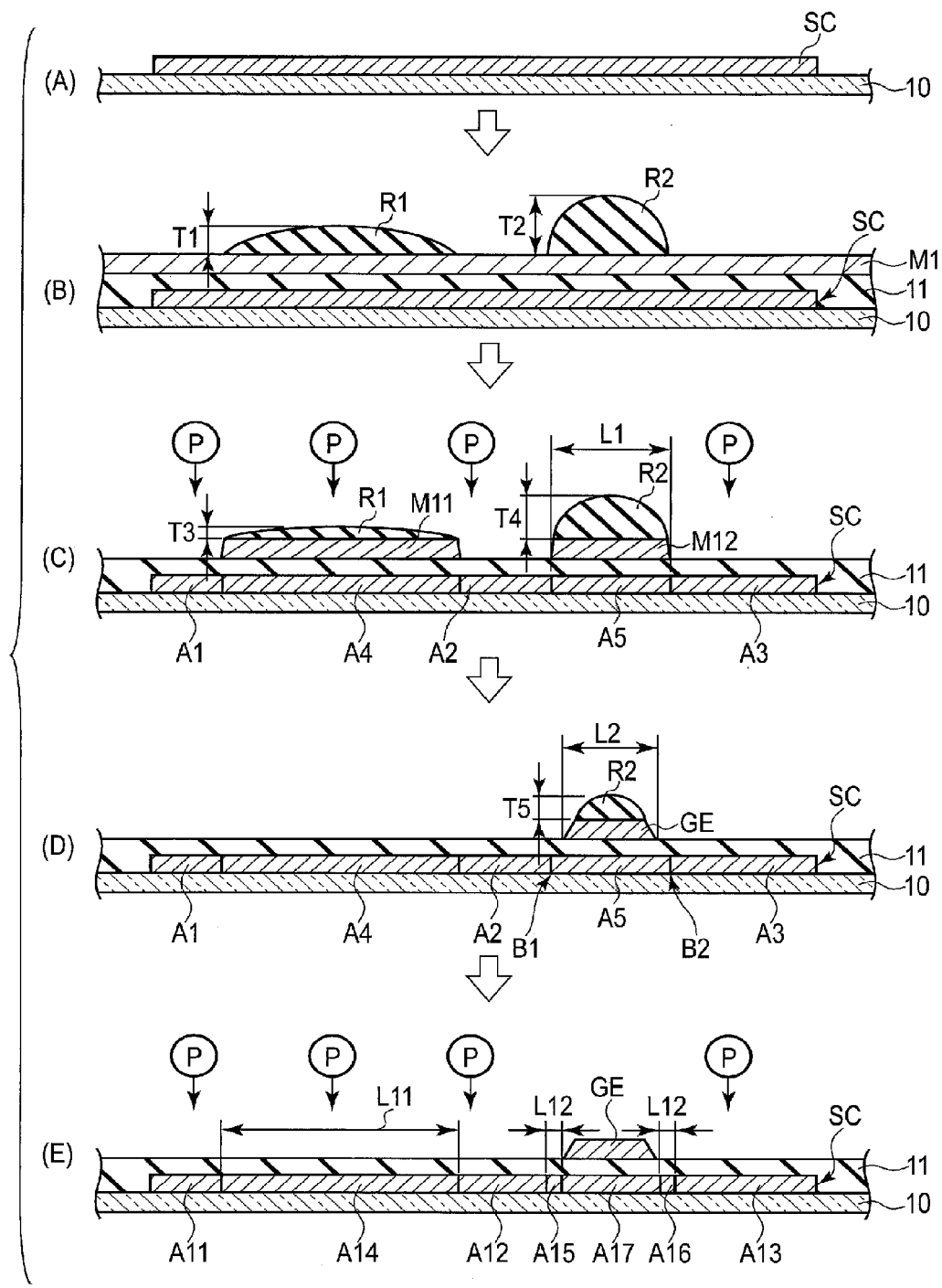
FIG. 2 is a view for describing a method of manufacturing the semiconductor device of the present embodiment.

Next, referring to FIGS. 2 and 3, a method of manufacturing the semiconductor device will be described. Note that the semiconductor device intended here corresponds to at least a part of a thin-film transistor which constitutes the above-described switching element SW or the peripheral circuit, a substrate comprising the thin-film transistor, a display panel comprising the substrate, or a display device comprising the display panel.

First, as shown in FIG. 2A, a semiconductor layer SC is formed on an insulating substrate 10. The semiconductor layer SC can be formed by the following method, for example. That is, after forming an amorphous silicon film on the insulating substrate 10 by plasma chemical vapor deposition (CVD), a polycrystalline silicon film is formed by irradiating excimer laser beams onto the amorphous silicon film.

After that, the polycrystalline silicon film is patterned by a photolithography process. In this way, the semiconductor layer SC formed to be insular as illustrated is formed. Further, although not illustrated in the drawing, an undercoat layer is formed between the insulating substrate 10 and the semiconductor layer SC. The undercoat layer is formed of, for example, silicon nitride (SiN) and silicon oxide (SiO).

Next, as shown in FIG. 2B, a first insulating film 11 is formed on the semiconductor layer SC. The first insulating film 11 is formed by depositing a silicon oxide made from tetraethyl orthosilicate (TEOS) on the insulating substrate 10 and the semiconductor layer SC by the plasma CVD, for example. Note that a material for forming the first insulating film 11 is not limited to TEOS.

After that, a metal layer M1 is formed on the first insulating film 11. The metal layer M1 is formed by, for example, depositing a metal material by sputtering. As the metal material for forming the metal layer M1, molybdenum, tungsten, titanium, aluminum, silver, etc., can be applied. In one example, the metal layer M1 is formed of molybdenum tungsten (MoW) alloy.

After that, on the metal layer M1, a first resist R1 and a second resist R2 having different film thicknesses are formed. In the example illustrated, the first resist R1 has a first film thickness T1 and the second resist R2 has a second film thickness T2 which is greater than the first film thickness T1. Also, the first resist R1 is separated from the second resist R2. Such first resist R1 and second resist R2 can be formed by the following technique, for example. That is, after applying a resist material on the metal layer M1, the resist material is exposed through a photolithographic mask of which transmissivity varies locally. As the resist material, the so-called positive resist material whereby the exposed portion is removed is applied. In the photolithographic mask, a first transmittance of an area corresponding to the first resist R1 is higher than a second transmittance of an area corresponding to the second resist R2. The second transmittance is, for example, substantially zero. Further, a third transmittance of the photolithographic mask of an area corresponding to areas around the first resist R1 and the second resist R2 is higher than the first transmittance. By developing the resist material exposed through such a photolithographic mask and cleaning it, the first resist R1 having the first film thickness T1 and the second resist R2 having the second film thickness T2 are formed.

Next, as shown in FIG. 2C, a first portion M11 and a second portion M12 are formed in the metal layer M1. The first portion M11 is separated from the second portion M12. The first portion M11 and the second portion M12 are formed by removing the metal layer M1 exposed from the first resist R1 and the second resist R2. For removal of the metal layer M1, wet etching which uses a solution to dissolve the metal layer M1 or dry etching which uses reactive ion gas or plasma gas, for example, can be applied. Note that in removing the metal layer M1, parts of the first resist R1 and the second resist R2 may be removed, so that the size of the first and second resists R1 and R2 may be reduced. In the example illustrated, after the metal layer M1 has been removed, the first resist R1 has a third film thickness T3 which is less than the first film thickness T1, and the second resist R2 has a fourth film thickness T4 which is less than the second film thickness T2. Further, the first resist R1 may be completely removed in accordance with the removal of the metal layer M1, in which case the third film thickness T3 becomes zero.

After that, by using the first portion M11 and the second portion M12 as masks, an impurity is implanted into the semiconductor layer SC. The impurity implanted is, for example, phosphorus (P), which is an N-type impurity. In this way, areas A1 to A3 into which the impurity is implanted are formed in the semiconductor layer SC. Further, in the semiconductor layer SC, almost no impurity is implanted into an area A4 which is opposed to the first portion M11, and an area A5 which is opposed to the second portion M12. Also, in the illustrated cross-section, the area A5 has a length L1 which is equivalent to the second portion M12.

Next, in addition to removing the first portion M11, the second portion M12 is reduced to form a gate electrode GE, as shown in FIG. 2D. For removal of the first portion M11, dry etching, for example, can be applied. At this time, while the first portion M11 is not covered by the first resist R1 or is covered by an extremely thin first resist R1, the second portion M12 is covered by the second resist R2 having the fourth film thickness T4 which is greater than the film thickness of the first resist R1. Accordingly, when etching is carried out under a condition of completely removing the first portion M11, although the second portion M12 is reduced, it cannot be completely removed. The position of an edge of the gate electrode GE formed in this way is more retracted than the position of an edge of the second portion M12. That is, a length L2 of the gate electrode GE is less than the length L1 shown in FIG. 2C. In other words, the gate electrode GE is located at an inner side of a border B1 between the area A5 and the area A2 and a border B2 between the area A5 and the area A3. Also, the second resist R2 obtained after the above-described gate electrode GE has been formed has a fifth film thickness T5 which is less than the fourth film thickness T4.

Next, after the second resist R2 is removed, as shown in FIG. 2(E), by using the gate electrode GE as a mask, an impurity is implanted into the semiconductor layer SC. The impurity implanted is, for example, phosphorus (P), which is an N-type impurity. At this time, the impurity is implanted under the condition that the concentration of the impurity is lower than that in a first impurity implantation step described with reference to FIG. 2C. Thereby, areas A11 to A16 into which the impurity is implanted are formed in the semiconductor layer SC. The areas A11 to A13 correspond to the areas A1 to A3, respectively. An impurity is implanted twice in all of these areas A11 to A13, and the impurity concentration in the areas A11 to A13 is substantially the same. The area A14 corresponds to the area A4 described above. Each of the areas A15 and A16 corresponds to a part of the area A5 described above. The area A15 is formed between the area A12 and an area A17, and the area A16 is formed between the area A13 and the area A17. An impurity is implanted in low concentration once in all of these areas A14 to A16, and the impurity concentration in the areas A14 to A16 is substantially the same. The impurity concentration in the areas A14 to A16 is lower than that in the areas A11 to A13. The areas A11 to A16 formed in this way correspond to impurity areas. Note that the areas A15 and A16 correspond to lightly-doped-drain (LDD) areas. In the semiconductor layer SC, almost no impurity is implanted into the area A17 which is opposed to the gate electrode GE. Such an area A17 corresponds to a channel area.

In the example illustrated, in the semiconductor layer SC, the channel area opposed to the gate electrode GE is the area A17, a first impurity area adjacent to the channel area is the area A15, a second impurity area adjacent to the first impurity area is the area A12, and a third impurity area adjacent to the second impurity area is the area A14. In addition, a length L11 of the area A14 is greater than a length L12 of the area A15. Note that the area A16 also has the same length L12 as the area A15.

Following that, as shown in FIG. 3A, a second insulating film 12 which covers the gate electrode GE and the first insulating film 11 is formed. Further, on the second insulating film 12, a third insulating film 13 is formed. The second insulating film 12 is formed by depositing a silicon nitride on the first insulating film 11 by, for example, the plasma CVD. The third insulating film 13 is formed by depositing a silicon oxide on the second insulating film 12 by, for example, the plasma CVD. It should be noted that materials for forming the second insulating film 12 and the third insulating film 13 are not limited to the above examples.

After that, a resist R11 of a predetermined pattern is formed on the third insulating film 13.

Following that, as shown in FIG. 3B, contact holes CH1 to CH3 are formed by removing the first to third insulating films 11 to 13 with the resist R11 used as a mask. The contact hole CH1 penetrates through the first to third insulating films 11 to 13 to the area A11 of the semiconductor layer SC. The contact hole CH2 penetrates through the second and third insulating films 12 and 13 to the gate electrode GE. The contact hole CH3 penetrates through the first to third insulating films 11 to 13 to the area A13 of the semiconductor layer SC.

After that, the resist R11 is removed.

Next, as shown in FIG. 3C, a metal layer M2 is formed on the third insulating film 13. The metal layer M2 is also filled into the contact holes CH1 to CH3.

After that, resists R21 to R23 of predetermined patterns are formed on the metal layer M2. The resist R21 is formed in an area opposed to the contact hole CH1, the resist R22 is formed in an area opposed to the contact hole CH2, and the resist R23 is formed in an area opposed to the contact hole CH3.

Next, as shown in FIG. 3D, electrodes E1 to E3 are formed in the metal layer M2. The electrodes E1 to E3 are separated from each other. These electrodes E1 to E3 are formed by removing the metal layer M2 exposed from the resists R21 to R23. The electrode E1 is connected to the area A11, the electrode E2 is connected to the gate electrode GE, and the electrode E3 is connected to the area A13.

After that, the resists R21 to R23 are removed. Thereby, a thin-film transistor TFT1 is formed.

According to the present embodiment described above, only one photolithographic mask (a halftone mask the transmissivity of which varies in a plurality of areas) is used from when the insular semiconductor layer SC is formed to when the areas A11 to A13, which are the high-impurity-concentration areas, and the areas A14 to A16, which are the low-impurity-concentration areas, are formed. Therefore, as compared to a manufacturing method in which a photolithographic mask for forming high-impurity-concentration areas and a photolithographic mask for forming the gate electrode GE must be prepared separately, the manufacturing method of the present embodiment can reduce the number of times of photo-etching processes and the productivity can be improved. In addition, the number of photolithographic masks to be prepared can be reduced, and the cost of manufacturing can be reduced.

Moreover, by implanting an impurity after forming the first resist R1 and the second resist R2 (or the first portion M11 and the second portion M12 of the metal layer M1) which are separated from each other into a desired shape, and then further implanting an impurity after forming the gate electrode GE in addition to completely removing the first resist R1 and the first portion M11, a low-impurity-concentration area (for example, the area A14) can be formed in a free pattern with the intervention of a high-impurity-concentration area (for example, the area A12). That is, the semiconductor layer SC having a flexible pattern can be formed with only a single photolithographic mask.

Further, since the first resist R1 and the second resist R2 are separated from each other, as compared to a manufacturing method in which a resist of a pattern with the joined first resist R1 and second resist R2 is applied, it is less likely to have variations in the film thickness or the shape of the resists and it becomes possible to prevent the processing accuracy from being decreased.

Moreover, in a process of dry etching of removing the first portion M11 of the metal layer M1 and also forming the gate electrode GE, by restraining acceleration of ions in the etching gas, etching of the first insulating film 11 can be restrained. Note that even in a case where such an etching condition is applied, it has been confirmed that the first portion M11 can be completely removed in a process of forming the gate electrode GE of a desired shape.

FIG. 4 is a plan view which shows an example of the semiconductor layer SC in the thin-film transistor TFT1 of the present embodiment, and a semiconductor layer SC2 in a thin-film transistor TFT2 of a comparative example.

As shown in FIG. 4 (A), the semiconductor layer SC of the thin-film transistor TFT1 includes the areas A11 to A13, which are the high-impurity-concentration areas, areas A14 to A16, which are the low-impurity-concentration areas, and the area A17, which is the channel area. Since the concentration of impurity in the areas A14 to A16 is lower than that of the areas A11 to A13, the areas A14 to 16 have high resistance. That is, the thin-film transistor TFT1 has the area A14 which is high in resistance between areas A11 and A12 which are low in resistance on one-end side of the gate electrode GE. Such an area A14 functions as, for example, a protective resistor, and protects the thin-film transistor TFT1 or an interconnect or the other circuit elements, etc., connected to the thin-film transistor TFT1 from static electricity. The length of such an area A14 which can be a protective resistor can be set freely according to the required specification by applying the manufacturing method of the present embodiment. Also, the areas A15 and A16 which are located on both sides of the gate electrode GE can serve as LDD areas.

The semiconductor layer SC2 of the thin-film transistor TFT2 shown in FIG. 4(B) includes areas A21 and A22, which are the high-impurity-concentration areas, areas A23 and A24, which are the low-impurity-concentration areas, and an area A25, which is the channel area. With respect to this thin-film transistor TFT2, the area A21 which is located on one-end side of the gate electrode GE is a low-resistance area likewise the areas A11 to A13. Accordingly, if the thin-film transistor TFT2 is to have a function of a protective resistor like the thin-film transistor TFT1, the full length of the area A21 must be increased. That is, area occupied by the thin-film transistor TFT2 becomes greater than that of the thin-film transistor TFT1.

In other words, according to the present embodiment, a thin-film transistor TFT1 having the function of a protective resistor can be formed with a small area of occupancy, and achieving a high-definition display device and reducing the size of the peripheral circuits are enabled.

As described above, according to the present embodiment, a method of manufacturing a semiconductor device capable of improving productivity can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device comprising:
    forming a semiconductor layer on a substrate;
    forming a first insulating film on the semiconductor layer;
    forming a metal layer on the first insulating film;
    forming a first portion and a second portion in the metal layer;
    implanting an impurity into the semiconductor layer by using the first portion and the second portion as masks;
    forming a gate electrode by reducing the second portion in addition to removing the first portion; and
    implanting an impurity into the semiconductor layer by using the gate electrode as a mask.

2. The method of claim 1, wherein:
    a channel area opposed to the gate electrode, a first impurity area adjacent to the channel area, a second impurity area adjacent to the first impurity area, and a third impurity area adjacent to the second impurity area are formed in the semiconductor layer;
    the first impurity area has an impurity concentration equivalent to that of the third impurity area; and
    the second impurity area has a higher impurity concentration than the first impurity area.

3. The method of claim 2, wherein a length of the third impurity area is greater than a length of the first impurity area.

4. The method of claim 1, wherein when the first portion and the second portion are formed, a first resist having a first film thickness, and a second resist having a second film thickness which is greater than the first film thickness are formed on the metal layer.

5. The method of claim 4, wherein the first portion and the second portion are formed by removing the metal layer exposed from the first resist and the second resist.

6. The method of claim 5, wherein after removal of the metal layer, the first resist has a third film thickness which is less than the first film thickness, and the second resist has a fourth film thickness which is less than the second film thickness.

7. The method of claim 6, wherein the third film thickness is zero.

8. The method of claim 6, wherein the first portion is completely removed when the gate electrode is formed, and the second resist after forming the gate electrode has a fifth film thickness which is less than the fourth film thickness.

9. The method of claim 8, further comprising removing the second resist.

10. The method of claim 9, further comprising forming a second insulating film which covers the gate electrode and the first insulating film.

11. The method of claim 4, wherein the first resist is separated from the second resist.

12. The method of claim 11, wherein the first portion is separated from the second portion.

13. The method of claim 4, wherein the first resist and the second resist are positive resists.

14. The method of claim 13, wherein a photolithographic mask which is used in forming the first resist and the second resist has a first transmittance in an area corresponding to the first resist, and a second transmittance in an area corresponding to the second resist, and the first transmittance is higher than the second transmittance.

15. The method of claim 14, wherein the second transmittance is zero.

16. The method of claim 14, wherein the photolithographic mask has a third transmittance which is higher than the first transmittance at an area corresponding to areas around the first resist and the second resist.

17. The method of claim 2, wherein the semiconductor layer includes a fourth impurity area whose impurity concentration is equivalent to that of the first area and which has a length equivalent to that of the first area, and the channel area is provided between the first impurity area and the fourth impurity area.

* * * * *